United States Patent
Hazeyama et al.

(10) Patent No.: US 7,230,328 B2
(45) Date of Patent: Jun. 12, 2007

(54) SEMICONDUCTOR PACKAGE AND LAMINATED SEMICONDUCTOR PACKAGE

(75) Inventors: Ichiro Hazeyama, Tokyo (JP); Yoshimichi Sogawa, Tokyo (JP); Takao Yamazaki, Tokyo (JP); Sakae Kitajo, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/528,160

(22) PCT Filed: Nov. 19, 2003

(86) PCT No.: PCT/JP03/14731

§ 371 (c)(1),
(2), (4) Date: Mar. 17, 2005

(87) PCT Pub. No.: WO2004/047173

PCT Pub. Date: Jun. 3, 2004

(65) Prior Publication Data

US 2006/0049495 A1    Mar. 9, 2006

(30) Foreign Application Priority Data

Nov. 20, 2002 (JP) .............................. 2002-335855

(51) Int. Cl.
*H01L 23/02* (2006.01)
(52) U.S. Cl. ..................... 257/685; 257/686; 257/700; 257/E23.004; 257/E23.078
(58) Field of Classification Search ................. 257/685
See application file for complete search history.

(56) References Cited

U.S. PATENT DOCUMENTS 5,028,986 A    7/1991  Sugano et al.
5,394,303 A *  2/1995  Yamaji ........................ 257/777
5,668,247 A *  9/1997  Furutani et al. ............ 528/353
6,465,893 B1* 10/2002  Khandros et al. ........... 257/777

FOREIGN PATENT DOCUMENTS

JP    6-97225 A    4/1994

(Continued)

OTHER PUBLICATIONS

JP 08-340021 Hitachi, Ltd: PAJ Machine Translation.*

(Continued)

*Primary Examiner*—Andy Huynh
*Assistant Examiner*—Earl N. Taylor
(74) *Attorney, Agent, or Firm*—Sughrue Mion, PLLC

(57) ABSTRACT

A semiconductor package has a semiconductor device chip and a flexible substrate having a thermoplastic insulating resin layer. An electrode provided on the flexible substrate is connected to a predetermined electrode of the semiconductor device chip and sealed by the thermoplastic insulating resin layer. The flexible substrate is bent and provided with electrodes on the electrode-bearing and other surfaces. The flexible substrate has multi-layered wirings. Grooves or thin layer portions having a different number of wiring layers are formed at bends of the flexible substrate or regions including the bends, thereby creating a cavity at a portion in which a semiconductor device is packaged. Then, the flexible substrate is bent at predetermined positions to form a semiconductor package which does not depend on the outer dimensions of the semiconductor device chip.

9 Claims, 18 Drawing Sheets

FOREIGN PATENT DOCUMENTS

| | | |
|---|---|---|
| JP | 8-335663 A | 12/1996 |
| JP | 8-340021 A | 12/1996 |
| JP | 2001-196504 A | 7/2001 |
| JP | 2001-308261 A | 11/2001 |

OTHER PUBLICATIONS

JP 2001-308261 Seiko Epson Corp.: PAJ Machine Translation.*

Dr. Ken Gilleo, Thomas Cinque, Steve Corbett, and Christopher Lee, Alpha Metals, "Thermoplastic Adhesives—The Attachment Solution For Multichip Modules", EPS Conference, Sep. 1993.*

Steve Corbett and Peter E Ongley, "Innovations In Thermoplastic Die Attach Adhesives For Microelectronic Packaging", Oct. 1997, http://ieeexplore.ieee.org/iel4/5267/14294/00656488.pdf?isnumber=&arnumber=656488.*

Peter R. Harper, "Thermoplastic Die Attach For Hermetic Packaging", Apr. 1994, http://ieeexplore.ieee.org/iel4/6078/16260/00753529.pdf?tp=&arnumber=753529&isnumber=16260.*

Ichiro, Anjoh, Asao Nishimura and Shuji Eguchi, "Advanced IC packaging for the future applications", Mar. 1998, http://ieeexplore.ieee.org/iel3/16/14384/00661237.pdf?isnumber=&arnumber=661237.*

* cited by examiner

SEMICONDUCTOR PACKAGE AND LAMINATED SEMICONDUCTOR PACKAGE

This application is a 371 of PCT/JP03/14731 filed on Nov. 19, 2003.

TECHNICAL FIELD

The present invention relates to thin semiconductor packages and three-dimensionally stacked semiconductor packages, and more particularly, to a semiconductor package and a stacked semiconductor package with an improved package structure which can facilitate packaging of semiconductor devices regardless of the number of input/output leads thereof.

BACKGROUND ART

FIGS. 22 through 25 are sectional views showing the conventional semiconductor packages described in Japanese Patent Laid-Open Publication No. Hei 8-335663. The semiconductor device shown in FIG. 22 is constructed such that electrode pads 504 of an interposer substrate 502 which has a patterned wiring 505 and an insulating film 510 laminated on both surfaces of the patterned wiring 505 are connected to the electrodes of a semiconductor chip 501 via conductors 503. Then, an insulating resin 509 is inserted in between the interposer substrate 502 and the semiconductor chip 501. Subsequently, the interposer substrate 502 is folded from the side surfaces to the rear surface of the semiconductor chip 501, and the insulating resin 509 is applied to an area of the rear surface of the semiconductor chip 501 at which the chip surface is exposed, thereby adhering the interposer substrate 502 to the semiconductor chip 501. This allows for obtaining a small semiconductor package which has generally the same size as that of a bare chip of the semiconductor chip 501. In this semiconductor device, the interposer substrate 502 is adhered to a surface of the semiconductor chip 501 using the insulating resin 509 which serves as an adhesive.

FIG. 23 shows a small three-dimensional semiconductor device which is constructed by stacking the semiconductor device shown in FIG. 22 in layers using solder bumps 507 as a coupling material, and has generally the same size as that of the bare chips.

FIG. 24 is a cross-sectional view showing the above-noted three-dimensional semiconductor devices packaged on a mother board substrate 511.

Additionally, FIG. 25 shows an underfill resin 508 filled around the solder bumps 507 that connect between the mother board substrate 511 of the three-dimensional semiconductor device packaged thereon and the lowermost stage semiconductor device.

FIGS. 26 to 29 are cross-sectional views showing other conventional semiconductor devices described in Japanese Patent Laid-Open Publication No. 2001-196504. The semiconductor device is constructed such that electrode pads 504 of a flexible interposer substrate (flexible substrate) 506 which has a patterned wiring 505 and a thermoplastic insulating resin 512 laminated on both surfaces of the patterned wiring 505 are connected to the electrodes of a semiconductor chip 501 via conductors 503. While being heated, the flexible interposer substrate (flexible substrate) 506 is then bent to be adhered to the side and rear surfaces of the semiconductor chip, thereby forming a small semiconductor package having generally the same size as that of the bare chip.

This semiconductor device is totally different from the one shown in FIG. 22 in using the thermoplastic resin as an insulator for the interposer substrate. Since the interposer substrate 506 itself has an adhesive property and is reduced in elastic modulus when heated, the process of bending the substrate to be adhered to the chip is more simplified than that for the semiconductor device shown in FIG. 22.

On the other hand, FIG. 27 illustrates a small three-dimensional semiconductor device which is constructed by stacking the semiconductor device shown in FIG. 26 in layers using the solder bumps 507 to have generally the same size as that of the bare chips.

FIG. 28 shows the three-dimensional semiconductor device packaged on the mother board substrate 511, and FIG. 29 shows the insulating resin 509 filled in between the lowermost stage semiconductor package and the mother board substrate 511.

By using a thin interposer substrate 502, the semiconductor package shown in FIG. 22 can be formed into a semiconductor package having generally the same size as that of the semiconductor device. Decreasing the package size is effective means for providing an increased packing density, and thus this package structure can be one of the effective means for forming small packages.

Furthermore, this package can be provided with the electrode pad 504 on the front and rear surfaces. Also, outer bumps 1a, 1b can be formed on the pads 504 like as a package shown in FIG. 20, thereby enabling not only planar packaging on a mother board substrate 7 but also three-dimensional packaging thereon by staking packages one on another like as a package shown in FIG. 21. The same semiconductor devices can be packaged in the packaging structure as shown in FIG. 27, thereby enabling high packing density packaging.

However, the conventional semiconductor package has a package structure that can provide a reduced planar packaging area and enables packaging at much higher packing densities through the three-dimensional packaging, but with some limitations. As described above, the same semiconductor devices or semiconductor devices having the same outer dimensions can be formed one on another in the three-dimensional packaging structure as shown in FIG. 27. However, as shown in FIG. 21, for the three-dimensional packaging of semiconductor devices having different outer dimensions, it is desirable for upper stage semiconductor packages 301a, 301b, 301c to have the same dimensions or to be reduced in size with respect to the lowermost stage semiconductor package 301d. This imposes a restriction on the order in which the semiconductor devices can be stacked in layers. The outer bump 1a serving for connection between packages can be located at the center of the package to provide a higher degree of flexibility to the order of stacking the packages according to their dimensions. However, this is not desirable in terms of ensuring the stability in packaging. It is also conceivable that the outer bump of an upper semiconductor package cannot be accommodated within the dimensions of its lower semiconductor package. Significant increases in number of input/output leads of semiconductor devices may cause the electrode pad of an upper semiconductor device to be placed with difficulty at a connectable area of its smaller lower semiconductor package. Even when this is possible, an extremely fine wiring patter would be required, thus resulting in a very expensive semiconductor package, which is not preferable. This problem with patterning would occur not only in the case where a lower semiconductor package is less in size than the upper semiconductor package but also in some other cases. When a semiconductor device with a large number of input/output leads is redesigned to have a wiring density enough for package-level packaging, such a case would occur in which a relocated electrode pad can not be accommodated within the area of the semiconductor device. This problem would affect the design rule for the interposer substrate responsible for re-patterning of wirings, and thus an out of spec design would have serious effects on manufacturing costs, which is not preferable.

As a solution to address these problems, the package may be conceivably increased in size relative to the semiconductor device. This seems to be against a feature that the package can be made generally in the same size as that of the semiconductor device. However, the package structure shown in FIG. 20 also has a feature that the package can be reduced in thickness. It can be effective means for high density packaging that the package is increased in area up to the necessary but least possible level for three-dimensional packaging of thin packages.

On the other hand, as means for reducing manufacturing costs for semiconductor devices, such a technique is employed in which their outer dimensions are reduced to provide an increased number of devices per wafer. For the semiconductor package shown in FIGS. 20 and 21, such a change in design would require a modification in design of a flexible substrate 101 which has been designed for each of the semiconductor packages 301a, 301b, 301c, and 301d. Furthermore, even when some of the semiconductor devices have been changed, the flexible substrate to be used for the semiconductor package present above or below them need to be changed in design.

Also as a method to address such a problem, packages are desirably standardized in size independent of semiconductor devices, e.g., in a fixed size or by providing the electrode pad at a predetermined location. To this end, such a structure is also desired which allows the package to be greater in size than the semiconductor device.

On the other hand, when a semiconductor device with a large number of input/output leads is re-patterned to have a wiring density enough for package level packaging, a re-patterned electrode pad can be accommodated within the area of the semiconductor device. However, in some cases, the re-patterning of wirings may be performed in a single layer with difficulty. Conventionally, the flexible substrate with an insulating film laminated on both surfaces of a patterned wiring has a patterned wiring portion formed in a single layer. A low wiring density would enable patterning in a single layer. However, when input/output leads are arranged in a grid pattern at an increased wiring density with an increased number of leads allocated to one side of the grid pattern, some patterning arrangements may be or may not be realized. This causes some restrictions to be imposed on the arrangement. It is thus desired a method for addressing these problems to provide a higher degree of flexibility to the flexible substrate to be employed.

DISCLOSURE OF THE INVENTION

It is therefore an object of the present invention to provide a semiconductor package and a three-dimensional stacked semiconductor package which allow the outer dimensions of the semiconductor package and the design flexibility of re-patterning of wirings to be independent of the semiconductor device, thereby facilitating three-dimensional packaging.

A semiconductor package according to the present invention has a semiconductor device with one or more electrodes being formed on a circuit-bearing surface and a flexible substrate with a thermoplastic insulating layer on either or both sides of a patterned wiring. An electrode provided on the flexible substrate is connected to the electrode of the semiconductor device and sealed by the thermoplastic insulating layer. The flexible substrate is bent, and an electrode can be provided on the electrode-bearing surface and another surface. The semiconductor package is characterized in that the flexible substrate has at least two or more layers of circuit patterns formed thereon.

In this semiconductor package, it is preferable to form a groove or a portion having less number of wiring layers at a bend of the flexible substrate or on a region including the bend. It is also possible to construct the semiconductor package such that a cavity is formed on the flexible substrate so as to accommodate the semiconductor device in the cavity portion.

A semiconductor package according to another aspect of the present invention has a semiconductor device with one or more electrodes being formed on a circuit-bearing surface, and a flexible substrate with a thermoplastic insulating material on either or both sides of a patterned wiring. An electrode provided on the flexible substrate is connected to the electrode of the semiconductor device and sealed by the thermoplastic insulating material. The flexible substrate is bent, and an electrode can be provided on the electrode-bearing surface and another surface. The semiconductor package is characterized in that the bent flexible substrate includes portions directly adhered to each other.

In this semiconductor package, a semiconductor device can be accommodated in a recessed portion created by the flexible substrates being bent and directly adhered to each other.

A stacked semiconductor package according to the present invention is characterized in that a plurality of the aforementioned semiconductor packages according to the present invention are three-dimensionally stacked in layers and electrically connected to each other via the electrode. In this case, the plurality of semiconductor packages may be either the same in structure or a plurality of semiconductor packages of different structures being stacked in layers.

To address the aforementioned problems, the present invention employs a flexible substrate, used for semiconductor packages, which has at least two or more layers of patterned wiring formed thereon. The flexible substrate having two or more layers of patterned wiring formed thereon is bent along the outer shape of the semiconductor device. To facilitate the bending, the bends are provided with a groove or a thin layer portion with a reduced number of wiring layers formed thereon.

Such a structure is introduced in which a cavity is formed on the flexible substrate, as means for reducing an increase in thickness of the flexible substrate caused by a plurality of wiring layers being introduced onto the flexible substrate, i.e., an increase in thickness of the semiconductor package.

Alternatively, to freely select the outer dimensions of the semiconductor package, such a structure is introduced which allows the bent flexible substrate has portions which are directly adhered to each other.

The semiconductor package according to the present invention allows for freely designing the outer dimensions and the arrangement of outer bumps serving to connect between semiconductor packages as well as for packaging different types of semiconductor devices having different dimensions and a different number of input/output leads for three-dimensional packaging.

That is, the semiconductor package and the stacked semiconductor package according to the present invention allow a plurality of semiconductor devices to be accommodated in a package reduced in thickness as well as to be stacked in layers for three-dimensional packaging without being restricted by the number of input/output leads and the outer dimensions of the semiconductor device. Furthermore, the present invention makes it possible to standardize the package size and the outer bump position.

BEST MODE FOR EMBODYING THE INVENTION

Figure 1:
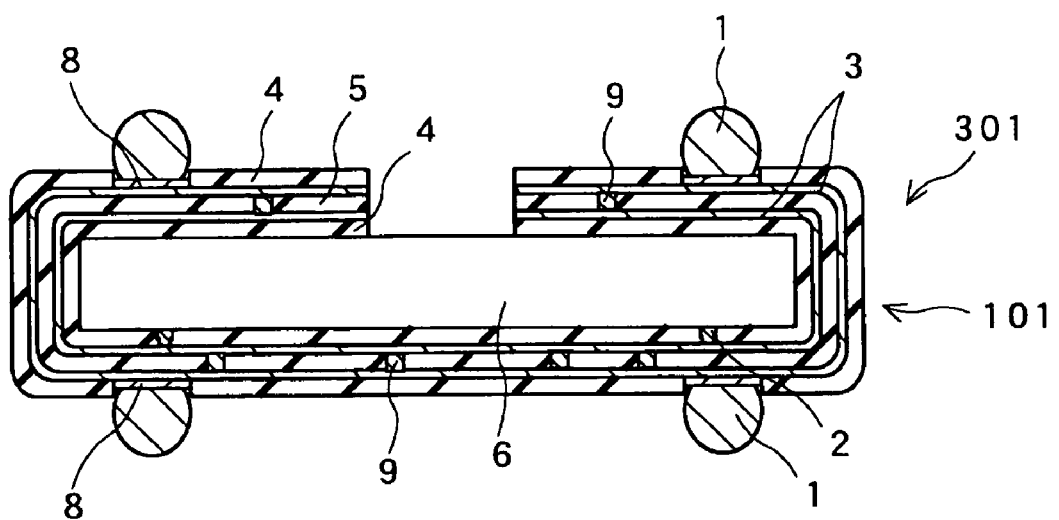
FIG. 1 is a cross-sectional view showing a semiconductor package according to a first embodiment of the present invention.

Now, embodiments of the present invention will be described below more specifically with reference to the accompanying drawings. FIG. 1 is a cross-sectional view showing a semiconductor package 301 according to the embodiment. There are one or more electrodes formed on a circuit-bearing surface of a semiconductor chip 6, around which a flexible substrate 101 is placed. The flexible substrate 101 is provided with a pair of wirings 3 formed on the front and rear surfaces of an insulating layer 5, and the outsides of the wirings 3 are also coated with thermoplastic resin layers 4. Instead of the thermoplastic resin layer 4 placed outside the flexible substrate 101, an insulating layer formed of an ordinary insulating material similar to that of the insulating layer 5 may also be placed. The pair of wirings 3 are connected through via holes 9 formed in the insulating layer 5. The inner wiring 3 on the flexible substrate 101 is connected to an inner bump 2 of the semiconductor chip 6, while an electrode pad 8 formed on the outer wiring 3 is connected with an outer bump 1. The inner bump 2 is sealed within the thermoplastic resin layer 4 formed of a thermoplastic insulating resin. The flexible substrate 101 is bent around the semiconductor chip 6 and provided with electrodes formed on a surface aligned with the electrode-bearing surface of the semiconductor chip 6 and at a predetermined position on another surface. The wirings 3 of the flexible substrate 101, which constitute the circuit pattern, may be not only of two layers as in the aforementioned embodiment but also of multi-layers such as three layers or more.

The flexible substrate 101 and the semiconductor chip 6 are connected to each other via the inner bump 2 which is pre-formed on the electrode of the semiconductor chip 6. At this time, the thermoplastic resin layer 4 formed on a surface of the flexible substrate 101 in contact with the semiconductor chip 6 is heated when connected, thereby allowing the connection to be sealed with the thermoplastic resin at the same time as the connection. In addition, the flexible substrate 101 can be bent along the semiconductor chip 6 while being heated, thereby facilitating the formation of the semiconductor package 301.

Figure 2:
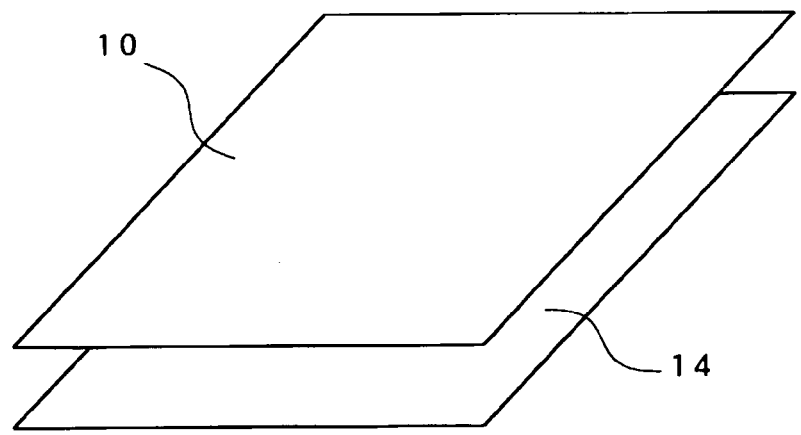
FIG. 2 is a perspective view showing a manufacturing step of a flexible substrate.
Figure 3:
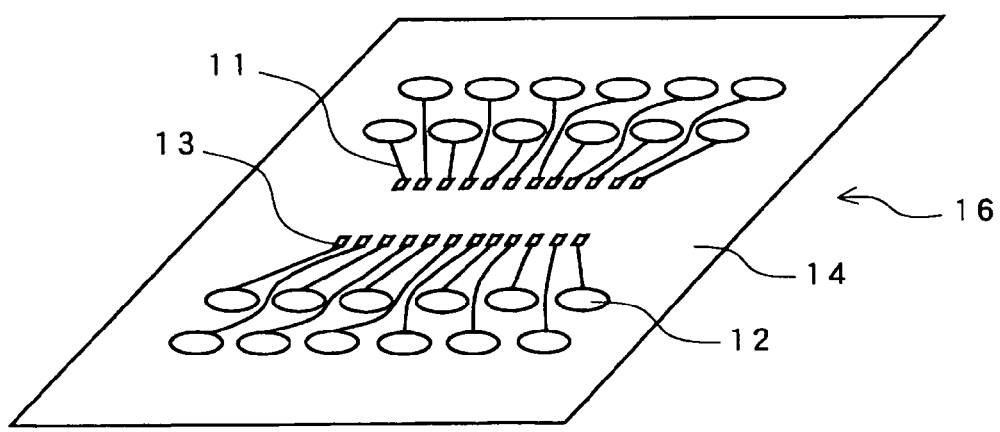
FIG. 3 is a cross-sectional view also showing a manufacturing step of a flexible substrate.

Now, an explanation is given to how the flexible substrate 101 is formed. This flexible substrate 101 is different from the flexible substrate shown in FIG. 1 in that a bend or an area including the bend is a groove or a thin layer portion 102 having a reduced number of wiring layers. The flexible substrate 101 is formed such that an insulating resin sheet 14 is affixed to a metal foil 10 as shown in FIG. 2, and then as shown in FIG. 3, the metal foil 10 is etched to form patterned wirings 11, outer pads 12, and inner pads 13, and then a plurality of insulating resin sheets 14 on which the patterned wirings 11 et al. are formed are affixed to each other. Those openings which are provided on the insulating resin sheet 14 at the positions aligned with the inner pads 13 and the outer pads 12 may be pre-formed on the insulating resin sheet 14 or may be formed after the insulating resin sheet 14 and the metal foil 10 are affixed to each other. The methods for forming the openings include etching, laser processing, or machining such as punching. A photosensitive resin may be used as an insulating resin sheet 14. In this case, the openings can be formed by photolithography. However, in terms of processing accuracy and costs, the openings are desirably formed using laser processing.

When wirings are formed in a single layer on the flexible substrate 101, the flexible substrate is formed of a thin thermoplastic resin layer, a metal foil to serve as a wiring layer, and a thin insulating resin layer or a thin thermoplastic resin layer. This facilitates bending and adhesion of the flexible substrate when heated and bent. The metal foil serving as a wiring layer can be formed of a metal such as copper, gold, or aluminum, or any other metals so long as they are electrically conductive; however, copper which is inexpensive but has a high electrical conductivity and good machinability is preferably employed. The processing to the metal foil can be done to the metal foil of a thickness on the order of several hundreds of micrometers. However, the foil of a thickness of 38 μm, 18 μm, 10 μm, or 5 μm preferably facilitates bending and makes an assembled semiconductor package thinner. On the other hand, the processing to the thermoplastic resin layer and the insulating resin layer can be done to the thermoplastic resin layer and the insulating resin layer of a thickness on the order of several hundreds and tens of micrometers. However, a thickness of 50 μm or less can preferably facilitate bending and makes an assembled semiconductor package thinner. Preferably a thickness of 25 μm or less, more preferably 10 μm or less, will be advantageous in making the package thinner. The thermoplastic resin may be any resin such as polyimide, polyamide, epoxy, or silicone resin so long as they have thermoplastic property, or a combination thereof. The thermoplastic resin is desirably composed predominantly of polyimide in terms of heat resistance and machinability.

To form a number of wirings on the flexible substrate 101, a thermoplastic resin should be used for the insulating resin layer to facilitate bending, and both the insulating resin layer and the metal foil layer are desirably made as thin as possible. However, in terms of ensuring stability in manufacturing the flexible substrate and reducing manufacturing costs, a groove or a portion having a different number of wiring layers is formed at a portion of the flexible substrate to be bent or at an area containing the portion to be bent. That is, a portion contributing to bending is made in a single layer or a nearly single layer, thereby facilitating the bending. Alternatively, a multi-layered wiring portion is prepared only for a portion requiring re-patterning of wirings, with the other portions containing the bend being made in a single layer or a nearly single layer.

Figure 4:
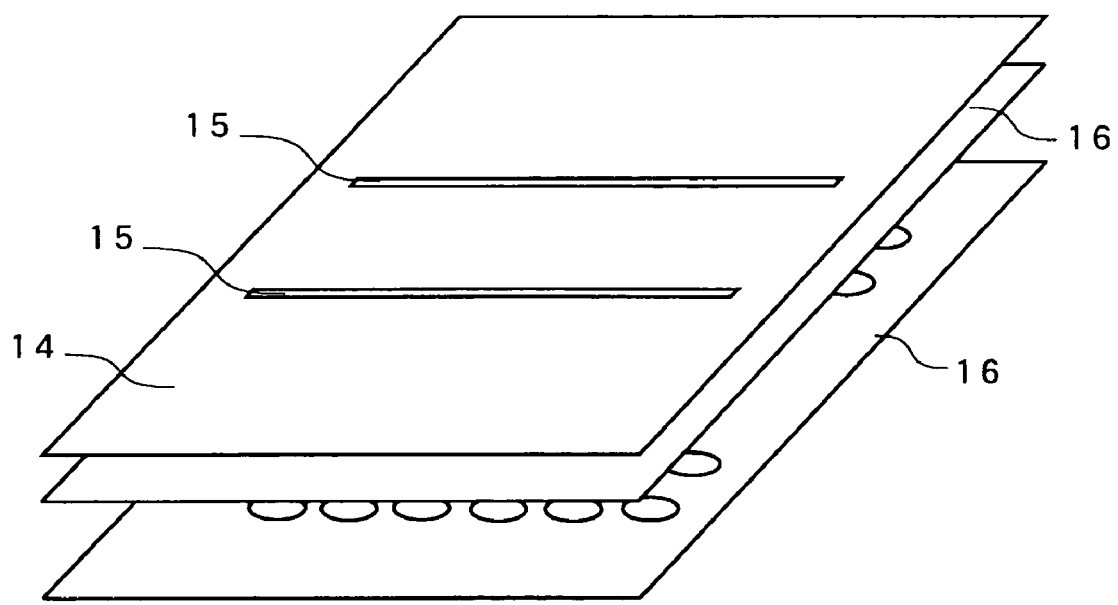
FIG. 4 is a cross-sectional view also showing a manufacturing step of a flexible substrate.
Figure 5:
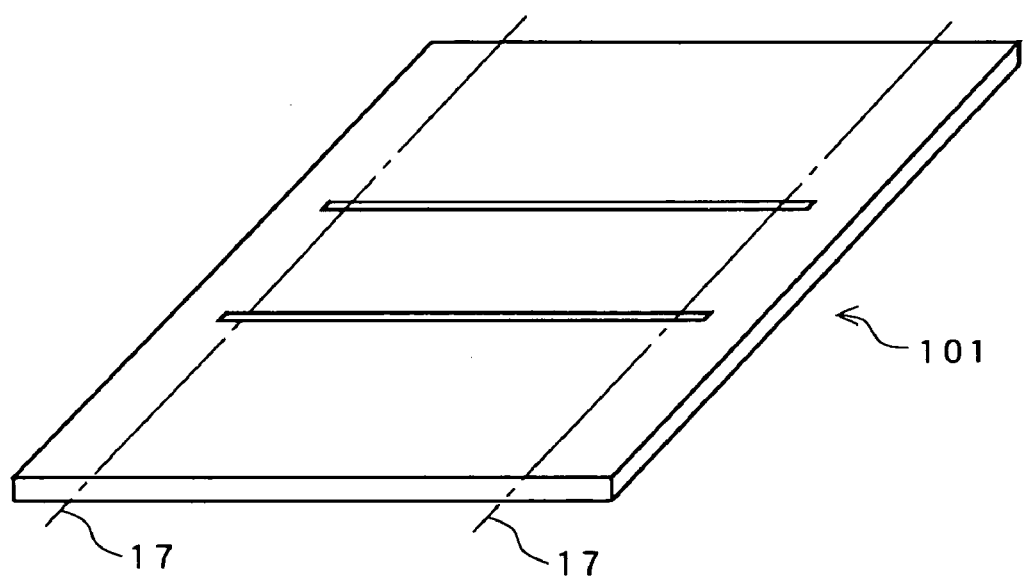
FIG. 5 is a cross-sectional view also showing a manufacturing step of a flexible substrate.

As described earlier, the flexible substrate 101 is formed by the insulating resin sheet 14 and the metal foil 10 being affixed to each other. Here, as shown in FIG. 4, in a step after the patterned wirings 11 or the like have been formed, the insulating resin sheets 14 having punched portions 15 pre-formed can be affixed to each other, thereby forming such groove portions. As shown in FIG. 5, after these grooves have been formed, the flexible substrate 101 is cut at appropriate cutting portions 17, thereby completing the flexible substrate 101 easy to bend.

Figure 6:
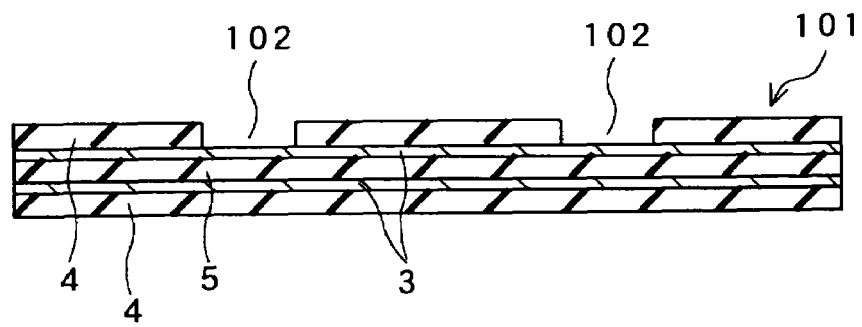
FIG. 6 is a cross-sectional view showing a flexible substrate.
Figure 7:
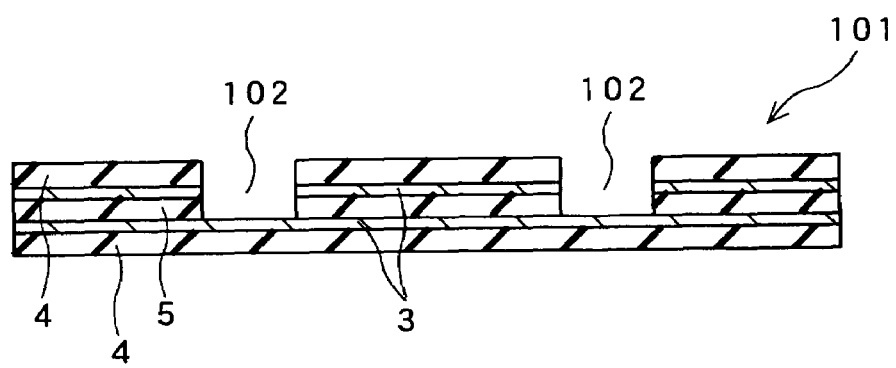
FIG. 7 is a cross-sectional view also showing a flexible substrate.
Figure 8:
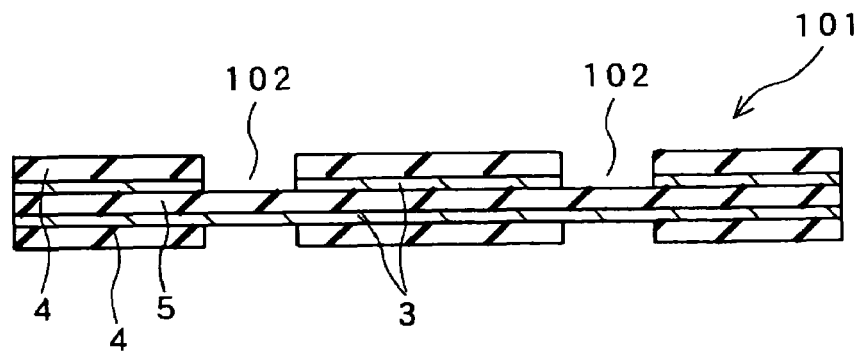
FIG. 8 is a cross-sectional view also showing a flexible substrate.

The combination of these grooves, the wirings 3 processed appropriately, the thermoplastic resin layer 4 and the insulating resin layer 5 makes it possible to form the structures as shown in FIGS. 6 through 8. FIG. 6 shows the grooves 102 formed in the upper thermoplastic resin layer 4, FIG. 7 showing the grooves 102 formed in the upper thermoplastic resin layer 4 and the intermediate insulating resin layer 5, and FIG. 8 showing the grooves 102 formed in the upper thermoplastic resin layer 4 and the lower thermoplastic resin layer 4.

On the other hand, the same processing method can be applied to the formation of grooves at the bends as well as to the formation of a cavity at the portion in which the semiconductor chip 6 is connected, thereby forming a structure in which the semiconductor chip 6 is embedded in the cavity defined in the flexible substrate 101.

Figure 9:
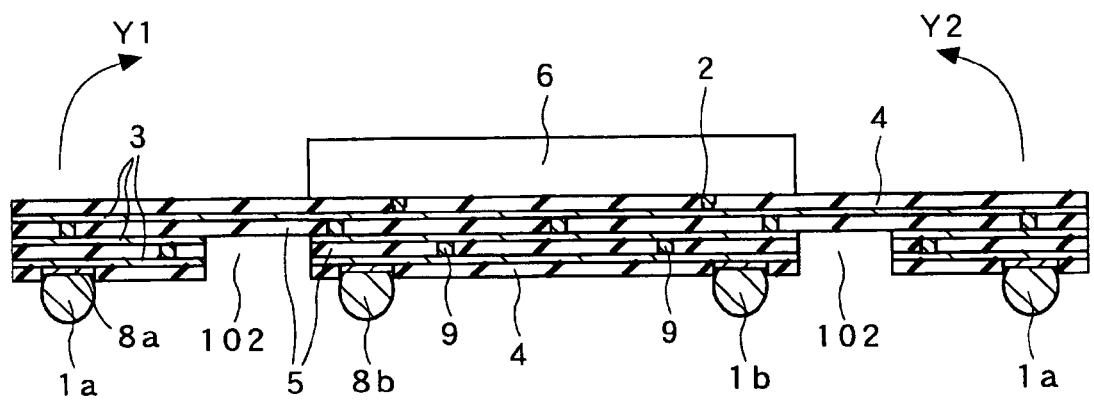
FIG. 9 is a cross-sectional view showing an assembly step of a semiconductor package according to a second embodiment of the present invention.
Figure 10:
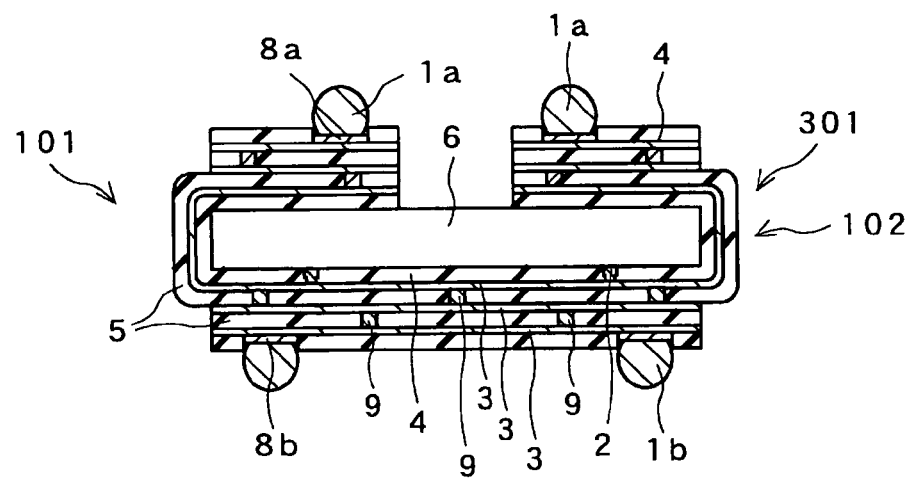
FIG. 10 is a cross-sectional view showing a semiconductor package according to the second embodiment of the present invention.

FIGS. 9 and 10 are cross-sectional views showing a second embodiment of the present invention. As shown in FIGS. 6 and 7, FIG. 9 is a cross-sectional view showing a step of forming a semiconductor package using the flexible substrate 102 having grooves formed in the thermoplastic resin layer 4 and the wiring 3 at one surface of the flexible substrate 102, and FIG. 10 is a cross-sectional view showing a semiconductor package after having been assembled. The flexible substrate 101 shown in FIGS. 9 and 10 is constructed such that two insulating layers 5 are formed on the both sides of a wiring 3 centered therebetween, and other two wirings 3 are then laminated on the both outsides of the insulating layers 5, and thermoplastic resin layers 4 are laminated on the outsides of the outside wirings 3, with the wiring layers arranged in three layers. The thermoplastic resin layer 4 on the lower surface of the flexible substrate 101, the two layers of wiring 3, and the middle wiring 3 are partially removed at the side portions below the lower surface of the semiconductor chip 6. The removed portions are thin layer portions 102 where only the thermoplastic resin layer 4, the wiring 3, and the insulating layer 5 are present. As illustrated with arrows Y1 and Y2 in FIG. 10, the flexible substrate 101 is folded to bring the uppermost thermoplastic resin layer 4 into contact with the side and upper surfaces of the semiconductor chip 6, thereby fabricating the semiconductor package 301. In this semiconductor package 301, the flexible substrate 101 on the side surfaces thereof has the thin layer portions 102 being half in thickness the portion on the lower surface of the semiconductor chip 6, thereby facilitating bending even at the portions such as the side surfaces of the semiconductor chip 6 where more force is required for bending.

Now, by way of example, an explanation is given to how the semiconductor package shown in FIGS. 9 and 10 is fabricated. For example, memory LSIs of three types having different dimensions and a logic LSI of one type are prepared as semiconductor devices. For example, the memory LSIs have outer dimensions of about 5 mm to 10 mm with about 50 input/output pins, while the logic LSI has outer dimensions of about 10 mm with about 400 input/output pins. For example, the LSIs are polished to a thickness of 50 μm and a gold bump is formed on each of the input/output leads.

For example, as the flexible substrate, prepared is a substrate which has a copper foil of 18 μm in thickness, and a thermoplastic polyimide of about 20 μm in thickness is formed on the front and rear surfaces of the copper foil. The portions to which the inner and outer bumps are connected are provided holes bored in the thermoplastic polyimide by laser processing and subjected to typical various pre-processing, and then plated with Ni and Au as a barrier metal.

Although the flexible substrate for use with the memory LSI is formed in a single layer, the flexible substrate 101 for use with the logic LSI is provided with wirings in three layers as shown in FIGS. 9 and 10. Furthermore, the flexible substrate 101 for use with the logic LSI is provided with grooves and thereby single layers or the thin layer portions 102 on the portions serving as the bends when the flexible substrate 101 is bent along the outer circumference of the semiconductor chip 6.

First, the LSIs are mounted on the flexible substrate, in the case of which an ordinary flip chip mounter can be used. The flexible substrate is fixed on a stage which can be heated, by vacuum adhesion, and the LSIs are aligned using a camera to be mounted thereon. During the mounting, pressure and heat are simultaneously applied to joint the Au bumps to the electrode pads of the flexible substrate. The heating is carried out at a temperature enough for the thermoplastic polyimide to start flowing, thereby allowing for joining the Au bump portions as well as sealing the joints.

Subsequently, the flexible substrate 101 is bent along the outer circumference of the semiconductor chip 6, thereby forming the semiconductor package 301. The flexible substrate is bent along one side of the semiconductor chip 6, and fixedly pressed against the opposite surface of the semiconductor chip 6 using a sufficiently heated jig. The flexible substrate for use with the logic LSI, which is provided in advance with the thin layer portions 102 at the bends, can be bent in the same manner as the package for memory LSIs.

After the flexible substrate has been sufficiently cooled down, the sample is taken out of the stage of the flip chip mounter, flux is applied to the electrode pads for the outer bumps pre-formed on the outer circumference portion, and then solder balls 1a, 1b are mounted thereon. For example, SnPb eutectic solder balls of 0.3 mm in diameter can be used; however, solders other than SnPb-based ones or Pb-free solders such as Sn—Ag and Sn—Zn based solders may also be used. After the solder balls have been mounted, the sample is dipped into a reflow furnace, thereby forming the solder bumps (outer bumps) on the semiconductor package. After having been dipped into the reflow furnace, the semiconductor package is cleaned and dried.

Four semiconductor packages thus fabricated are stacked in layers and allowed through the reflow step, thereby providing a three-dimensionally packaged stacked semiconductor package. Although the logic LSI has as many as 400 input/output pins and requires external terminals to be formed in a 0.5 mm-pitch complete area array, the semiconductor package thus obtained enables packaging generally in the same size as the outer dimensions of the LSI. The four semiconductor packages can also be packaged three-dimensionally.

Figure 11:
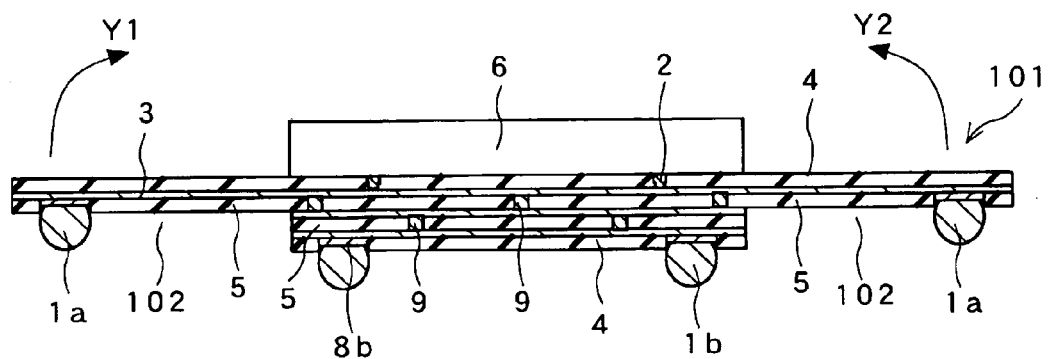
FIG. 11 is a cross-sectional view showing an assembly step of a semiconductor package according to a third embodiment of the present invention.
Figure 12:
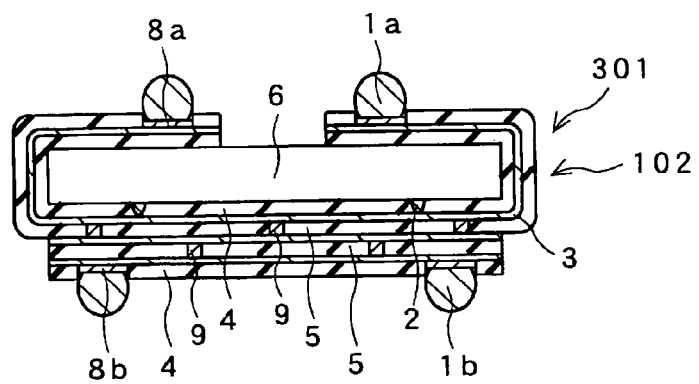
FIG. 12 is a cross-sectional view showing a semiconductor package according to the third embodiment of the present invention.

FIGS. 11 and 12 are cross-sectional views showing a third embodiment of the present invention. The semiconductor package according to the third embodiment is constructed in the same manner as the aforementioned second embodiment but different in the following two points. One is that the flexible substrate 101 is provided with the three-layer wiring structure left at the portion to which the semiconductor chip 6 is provided and all the other portions than this portion are provided with the thin layer portions 102 all of which have a single-layer wiring. The other is that the solder balls 1a provided on both the ends of the flexible substrate 101 are directly connected to the wiring in the uppermost layer (a single layer) but not to the wiring in the lowermost layer of the three layers. The flexible substrate 101 also has the thin layer portions 102 at the bends on the sides of the semiconductor chip 6, thereby being readily bent.

Now, by way of example, an explanation is given to how the semiconductor package having this structure is fabricated. A memory LSI of one type and a logic LSI of one type are prepared as semiconductor devices. The memory LSI has outer dimensions of about 5 mm×10 mm with about 50 input/output pins, while the logic LSI has outer dimensions of about 10 mm×100 mm with about 200 input/output pins. Each of the LSIs is polished to a thickness of 50 μm with a gold bump being formed on each of the input/output leads.

As the flexible substrate, prepared is a substrate which has a copper foil of 18 μm in thickness, on the front and rear surfaces of which formed is a thermoplastic polyimide of about 20 μm in thickness. The thermoplastic polyimide at the portions to which the inner and outer bumps are connected are provided with holes bored therethrough by laser processing and subjected to ordinary various pre-processing, and then plated with Ni and Au as a barrier metal.

Although the flexible substrate for use with the memory LSI is formed in a single layer, the flexible substrate 101 for use with the logic LSI is provided with three wiring layers as shown in FIGS. 11 and 12. Furthermore, in the flexible substrate 101 for use with the logic LSI, three wiring layers are formed only on the area to which the semiconductor chip 6 is packaged, while a single layer is formed on the other portion.

Like the embodiment shown in FIGS. 9 and 10, the LSIs are mounted on the flexible substrate and then the flexible substrate 101 is bent along the outer circumference of the semiconductor chip 6, thereby forming the semiconductor package 301. The flexible substrate 101 for use with the logic LSI has single layer bends, thereby being readily bent as in the case of the memory LSI.

Outer bumps are also formed to stack semiconductor packages in layers. The two semiconductor packages thus obtained can have sufficient number of outer bumps disposed on the LSI packaging area for connections of wirings, though the logic LSI has as many as 200 input/output pins. Furthermore, these semiconductor packages can be stacked in layers, thereby forming a three-dimensional package.

Figure 13:
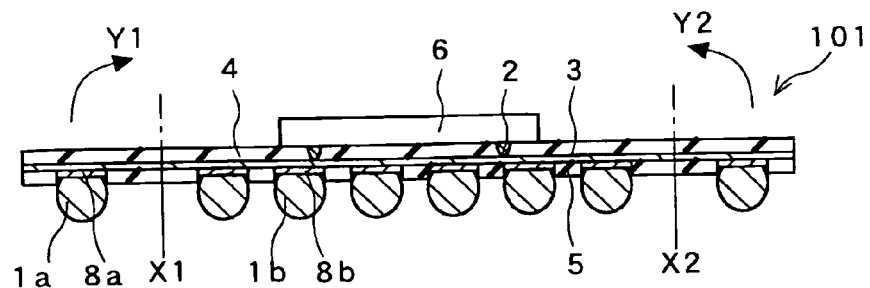
FIG. 13 is a cross-sectional view showing an assembly step of a semiconductor package according to a fourth embodiment of the present invention.
Figure 14:
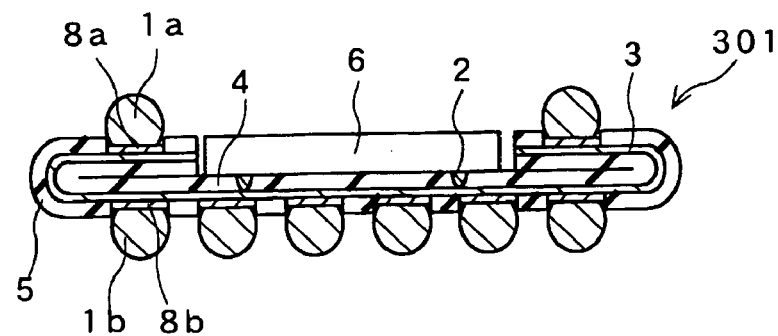
FIG. 14 is a cross-sectional view showing a semiconductor package according to the fourth embodiment of the present invention.
Figure 15:
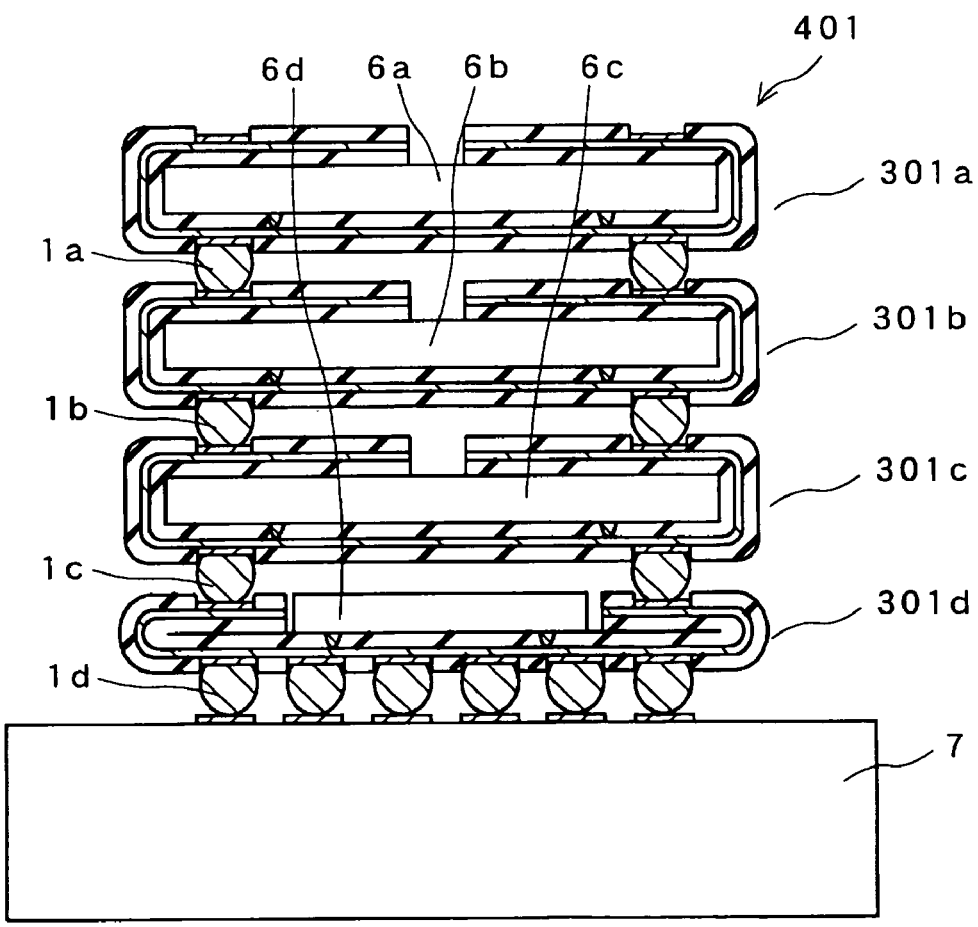
FIG. 15 is a cross-sectional view showing a stacked semiconductor package having this semiconductor package stacked in layers.

Now, a fourth embodiment of the present invention will be described. FIGS. 13 to 15 are cross-sectional views showing a semiconductor package according to the fourth embodiment. This semiconductor package has a semiconductor device and a flexible substrate having a thermoplastic insulating material on either or both sides of a patterned wiring. The semiconductor package allows the electrode provided on the flexible substrate to be connected to a predetermined electrode of the semiconductor device and sealed by the thermoplastic insulating material, the flexible substrate to be bent, and electrodes to be formed on the electrode-bearing surface and another surface. The semiconductor package is characterized in that a flexible substrate has portions which are directly adhered to each other when the flexible substrate is bent.

That is, the flexible substrate 101 is bent along the outer circumference portion of the semiconductor chip 6, thereby making it possible to fabricate the semiconductor package 301 having generally the same outer dimensions as those of the semiconductor chip 6. However, the flexible substrate 101 is bent at predetermined positions (X1, X2) off the outer dimensions of the semiconductor chip 6, thereby affixing the portions of the flexible substrate 101 to each other via the thermoplastic resin layers 4.

This package structure has a demerit that the outer dimensions are greater than those of the semiconductor chip 6. However, it still provides a thin semiconductor package and makes it possible to form a large number of electrode pads 8b on the lower surface of the semiconductor package. That is, this embodiment provides a merit of being available for semiconductor devices having high input/output pin counts. Furthermore, a plurality of such semiconductor devices can be packaged for three-dimensional packaging regardless of the outer dimensions of the semiconductor devices and the input/output pin counts.

Such a semiconductor package can be formed such that the semiconductor chip 6 is connected to the flexible substrate 101, and then the outer circumference portion thereof is bent in the directions Y1 and Y2 while the flexible substrate is being pressed at predetermined positions (X1, X2) and heated. It is also possible to bend the flexible substrate 101 in advance and then mount the semiconductor chip 6 thereon.

Although the semiconductor package structures described above each can be used alone, a plurality of features can be incorporated into one semiconductor package upon manufacture. The semiconductor packages thus fabricated can also be three-dimensionally packaged to form a stacked semiconductor package as shown in FIG. 15.

Now, by way of example, an explanation is given to how to fabricate the semiconductor package shown in FIGS. 13 and 14. The semiconductor package as shown in FIGS. 13 and 14 is fabricated using a semiconductor chip 6 having outer dimensions of 5 mm×5 mm and the number of input/output leads of 100.

On the flexible substrate 101, the pads to which the semiconductor chip 6 is connected are formed on the thermoplastic resin bearing surface, and electrode pads 8a, 8b for use with outer bumps 1 are formed on the opposite surface. The electrode pad 8a is used with connection for three-dimensional packaging while the electrode pad 8b is used for packaging on the mother board 7. However, due to a large number of input/output leads, the electrode pad 8b is disposed beyond the packaging area for the semiconductor chip 6.

Then, the semiconductor chip 6 is connected to the flexible substrate 101 via the inner bump 2 formed of gold bump pre-formed on the semiconductor chip 6. At this time, in the same method as shown in FIGS. 9 and 10, the connection and sealing can be performed at the same time. The flexible substrate 101 is then fixed to a jig. The jig holds only the portion within between the predetermined bends X1 and X2 of the flexible substrate 101 but not the outer circumference portion thereof. The outer circumference portions outside X1 and X2 which are not held are bent in the directions shown by arrows Y1 and Y2 using another jig, which can be heated, to be pressed against and affixed to the flexible substrate 101 itself by being heated.

The bends X1 and X2 are designed in advance to stay at such positions as not to overlap the semiconductor chip 6, and can be shaped so that the semiconductor chip 6 is surrounded by the flexible substrate 101 as shown in FIG. 14. For example, the wiring layer used for the flexible substrate 101 is a copper foil of 18 μm in thickness, with the resin layer being 20 μm in thickness. The semiconductor chip 6 can be made as thin as about 60 μm in thickness by polishing or the like to be thereby reduced approximately within the thickness to which the flexible substrate 101 is folded.

As shown in FIG. 15, the semiconductor package 301d thus obtained can be three-dimensionally packaged in conjunction with semiconductor packages 301a, 301b, 301c which are fabricated using semiconductor chips 6a, 6b, 6c having larger outer dimensions in accordance with the outer dimensions, thereby forming a stacked semiconductor package 401.

Figure 16:
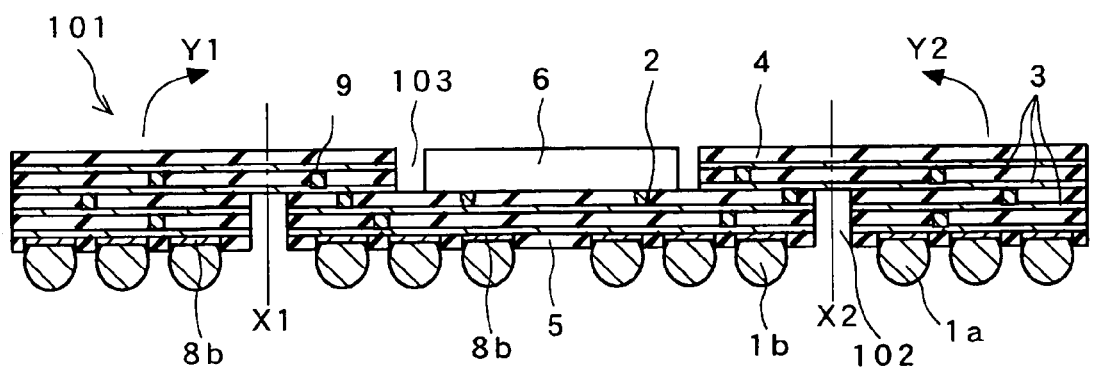
FIG. 16 is a cross-sectional view showing an assembly step of a semiconductor package according to a fifth embodiment of the present invention.
Figure 17:
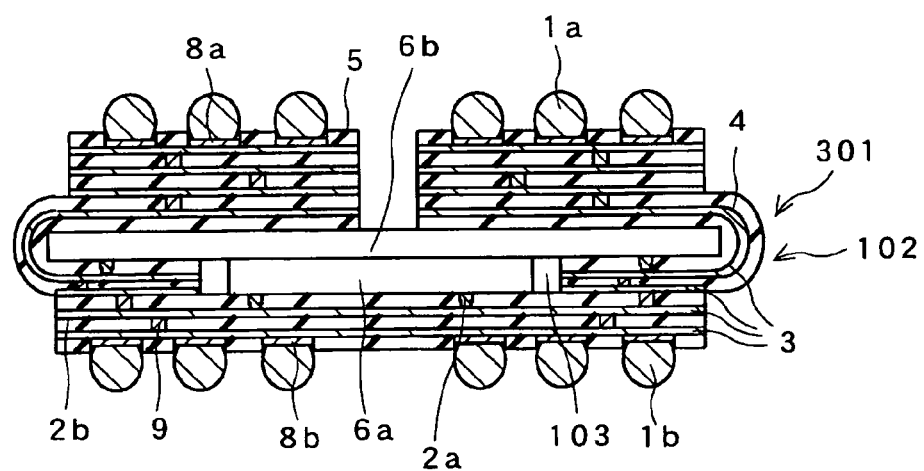
FIG. 17 is a cross-sectional view showing a semiconductor package according to the fifth embodiment of the present invention.

FIGS. 16 and 17 are cross-sectional views showing a semiconductor package according to a fifth embodiment of the present invention. Referring to FIGS. 16 and 17, an explanation is given to how the semiconductor package according to this embodiment is fabricated. The flexible substrate 101 having wirings stacked in layers is provided with the thin layer portions 102 and a cavity 103 as shown in FIG. 16. For example, the wiring layer of the flexible substrate 101 is formed of a copper foil of about 20 μm in thickness, while each of the insulating resin layer 5 and the thermoplastic resin layer 4 is formed in a thickness of about 20 μm. The thin layer portions 102 is adapted to have a single layer of wiring, while the cavity 103 is designed to suit the outer dimensions of the semiconductor chip 6 to be packaged.

In the same manner as in the first embodiment, the semiconductor chip 6 reduced in thickness down to about 60 μm is connected and adhered to a predetermined position on the flexible substrate 101. Thereafter, the flexible substrate 101 is bent in the directions indicated by arrows Y1 and Y2 at the centers X1 and X2 of the thin layer portions 102. Upon being bent, the both end parts of the flexible substrate 101 is held with a jig that can be heated, and adhered to the other parts of the flexible substrate 101 and the semiconductor chip 6 via the thermoplastic resin layers. 4.

The semiconductor package 301 thus obtained can have the large number of electrode pads 8a, 8b disposed on both the sides of the package for electrical connections, thereby making it possible to fabricate the semiconductor package 301 irrespective of the number of the input/output leads of the semiconductor chip 6. On the other hand, to package these semiconductor packages three-dimensionally, it is possible to form a number of connection bumps on any semiconductor package to be packaged either at a lower or upper position. It is also possible to determine the outer dimensions of a package irrespective of the outer dimensions of semiconductor devices, thereby realizing a package having a high degree of design freedom.

Figure 18:
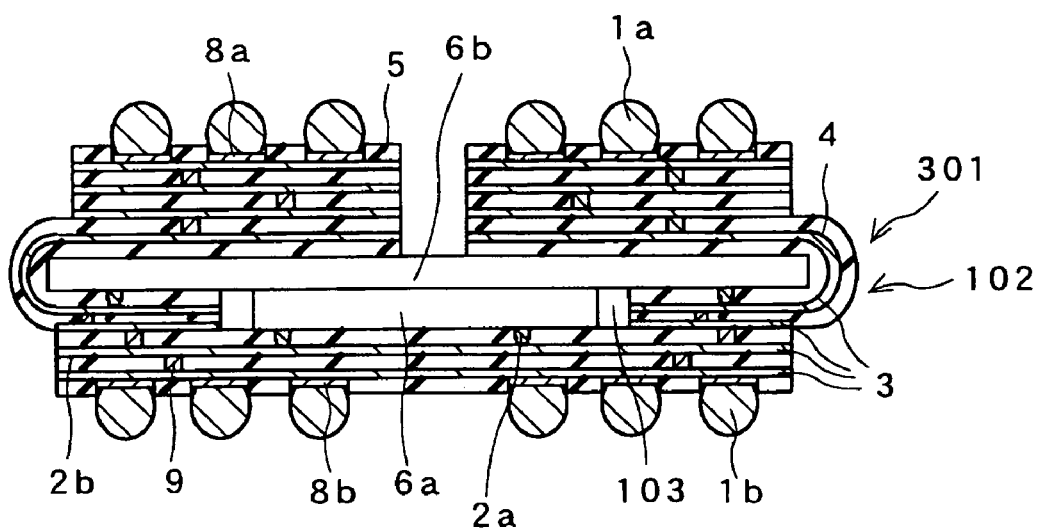
FIG. 18 is a cross-sectional view showing an assembly step of a semiconductor package according to a sixth embodiment of the present invention.

Now, referring to FIG. 18, a semiconductor package according to a sixth embodiment of the present invention will be described. The flexible substrate 101 has the thin layer portions 102 at the bends and the cavity 103 at the packaging portion for a semiconductor chip 6a. Two semiconductor devices are packaged on the flexible substrate 101. The semiconductor chip 6a which is one of the semiconductor devices is packaged in the cavity 103. This allows the other semiconductor chip 6b to be packaged on the same surface of the flexible substrate 101. The flexible substrate 101 is bent at the thin layer portions 102 and then adhered along the semiconductor chip 6b, thereby forming the semiconductor package 301.

The semiconductor package 301 thus obtained allows a larger number of electrode pads 8a, 8b to be formed on a multi-layered wiring area, thereby being three-dimensionally packaged via the outer bumps 1a, 1b formed on the existing electrode pads.

Figure 19:
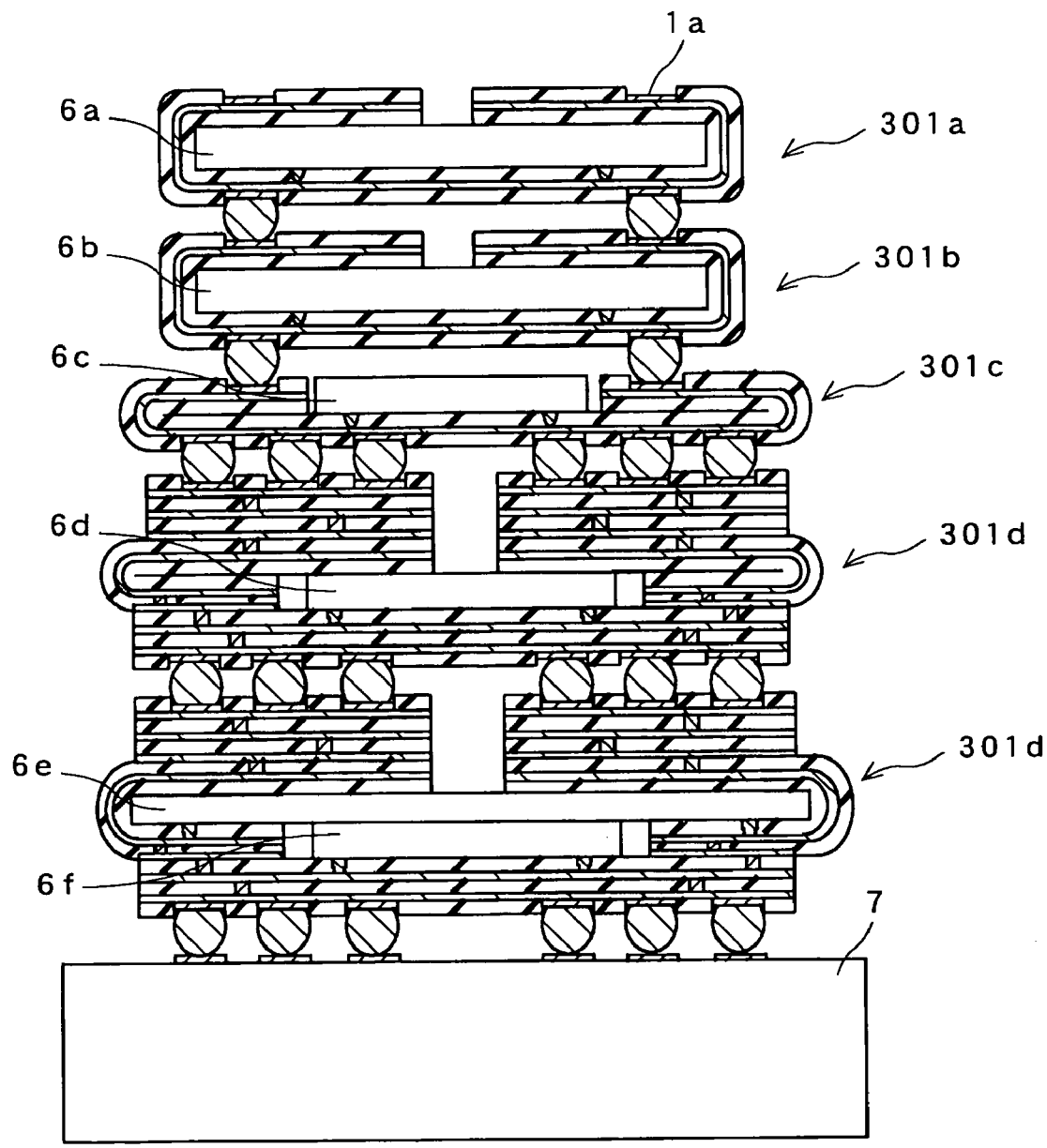
FIG. 19 is a cross-sectional view showing a stacked semiconductor package using the semiconductor package according to the sixth embodiment of the present invention stacked in layers.
Figure 20:
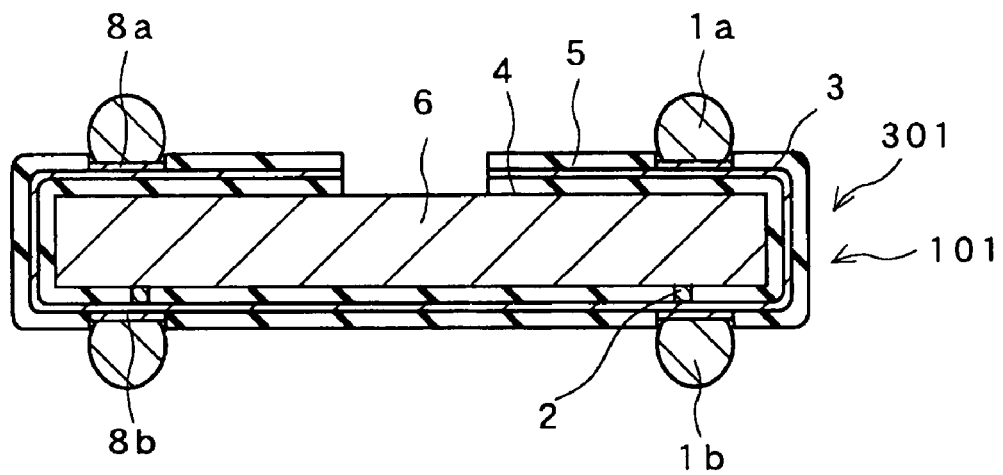
FIG. 20 is a cross-sectional view showing a semiconductor package.
Figure 21:
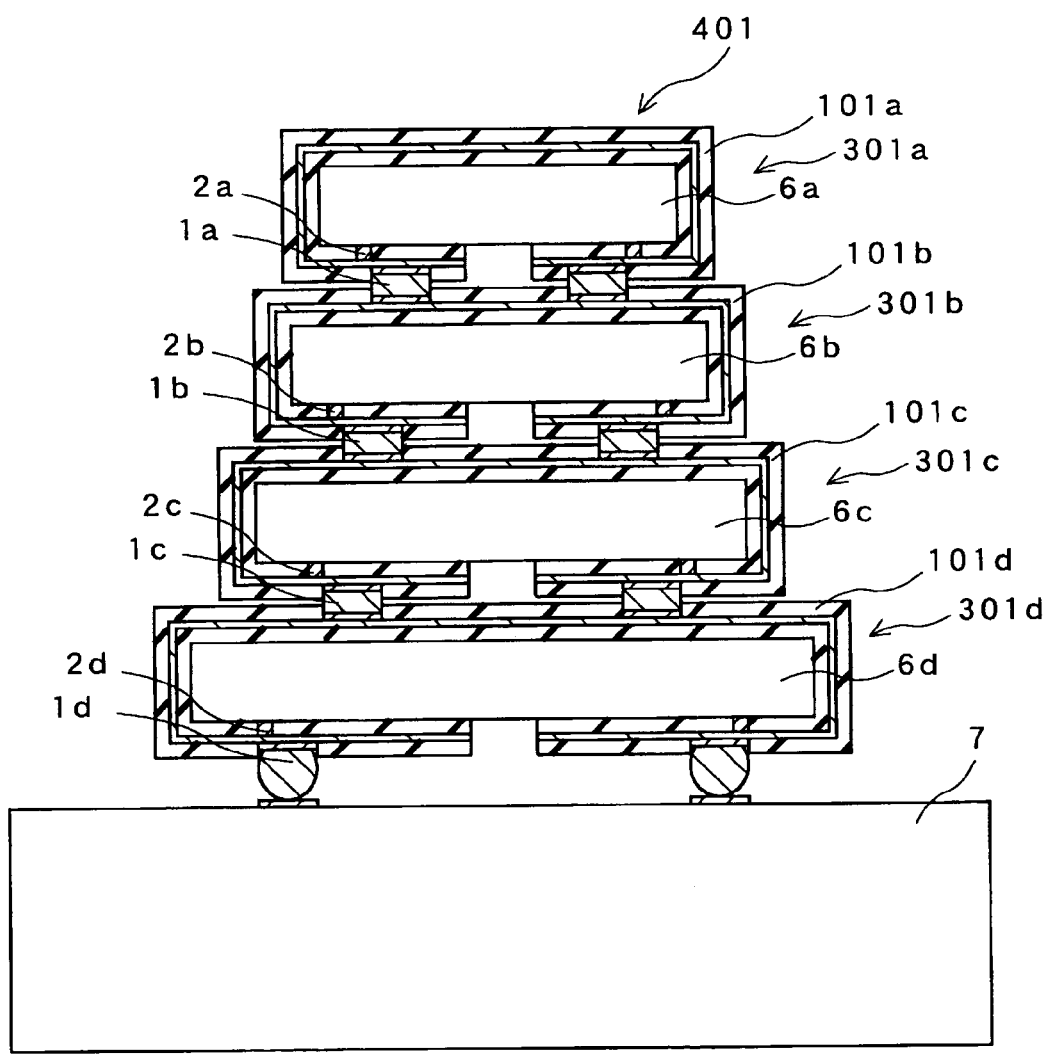
FIG. 21 is a cross-sectional view showing a stacked semiconductor package having the semiconductor package stacked in layers.
Figure 22:
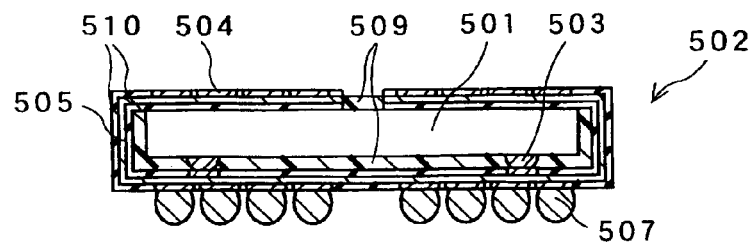
FIG. 22 is a cross-sectional view showing a conventional semiconductor package.
Figure 23:
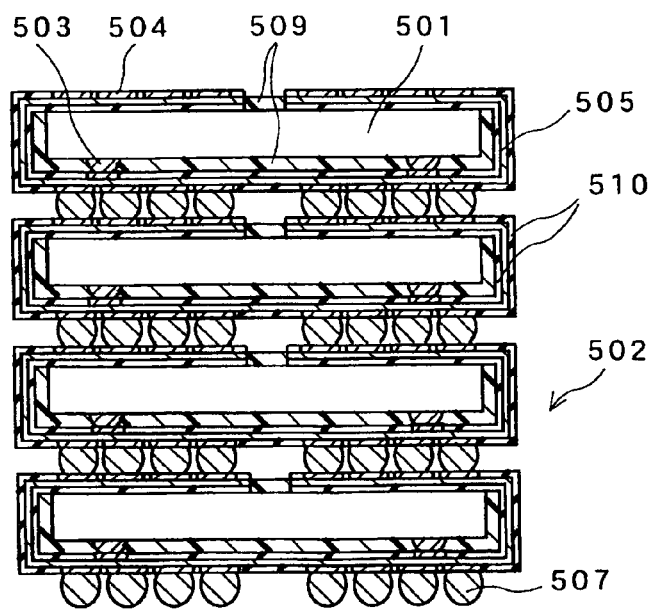
FIG. 23 is a cross-sectional view showing the conventional semiconductor package stacked in layers.
Figure 24:
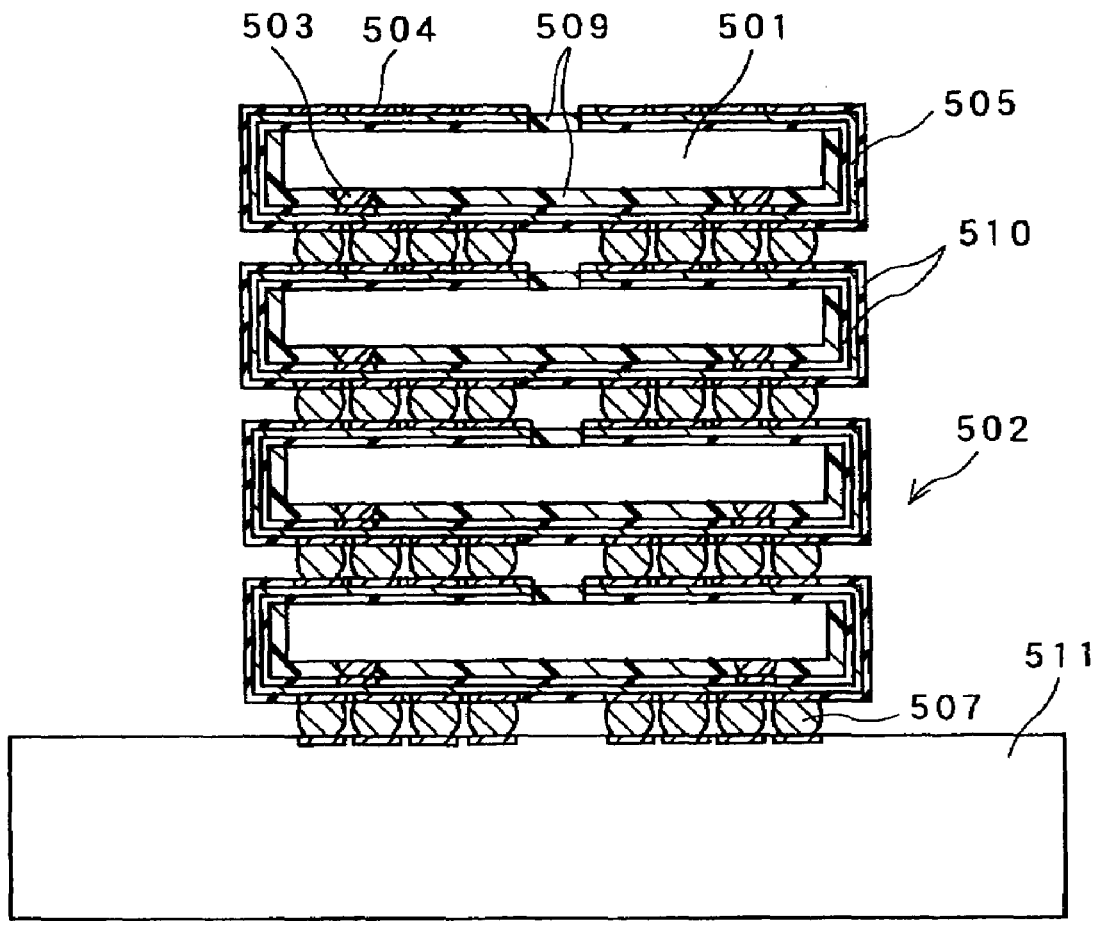
FIG. 24 is a cross-sectional view showing the stacked semiconductor package being packaged on a mother board substrate.
Figure 25:
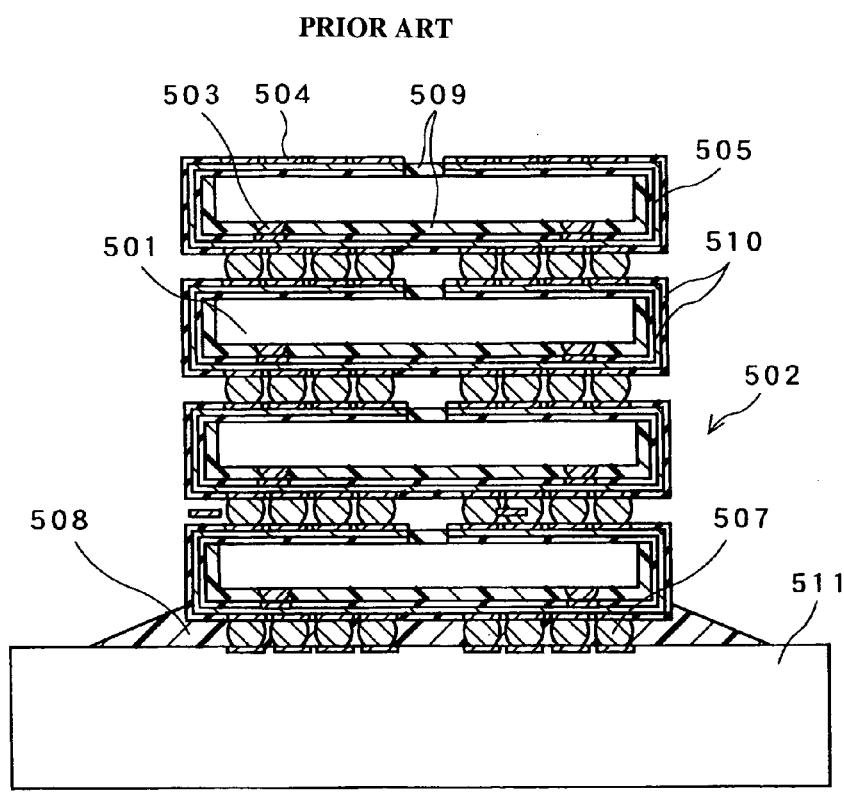
FIG. 25 is a cross-sectional view showing an underfill resin being filled.
Figure 26:
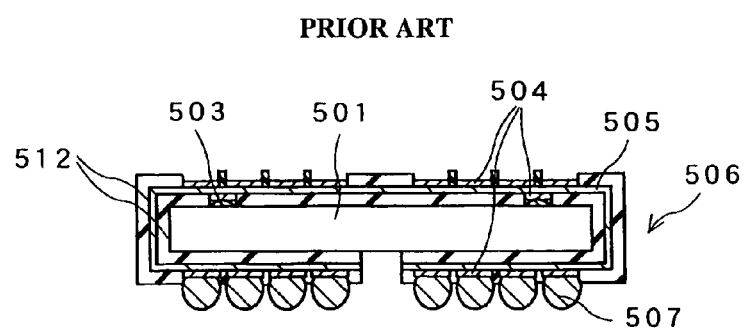
FIG. 26 is a cross-sectional view showing another conventional semiconductor package.
Figure 27:
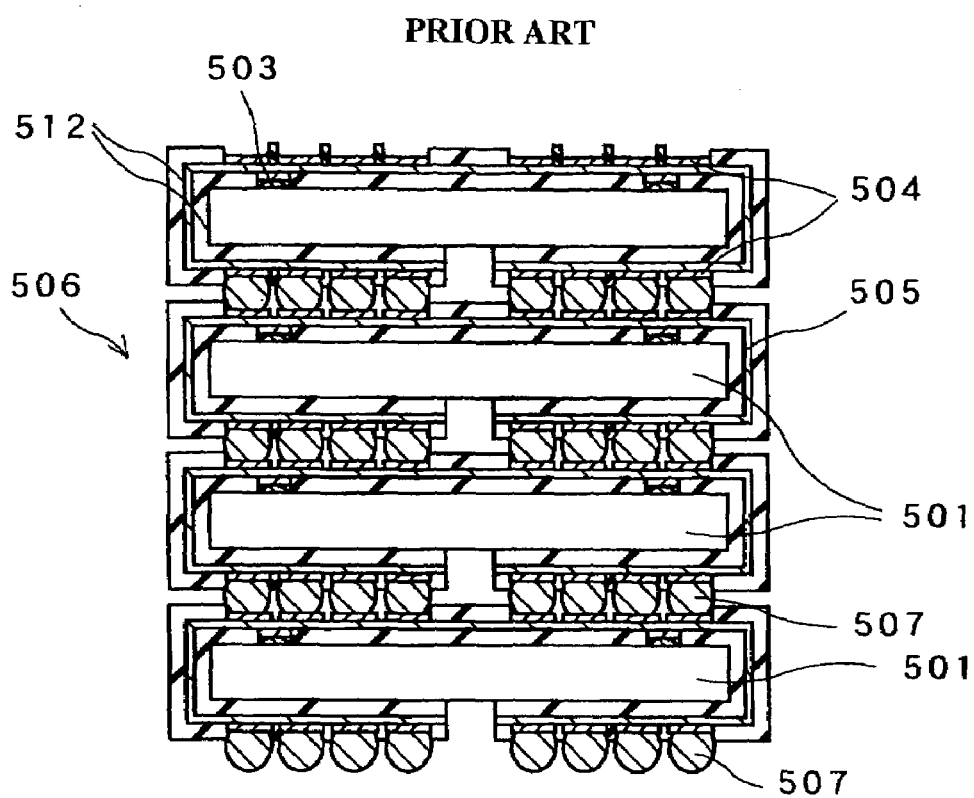
FIG. 27 is a cross-sectional view showing the conventional semiconductor package stacked in layers.
Figure 28:
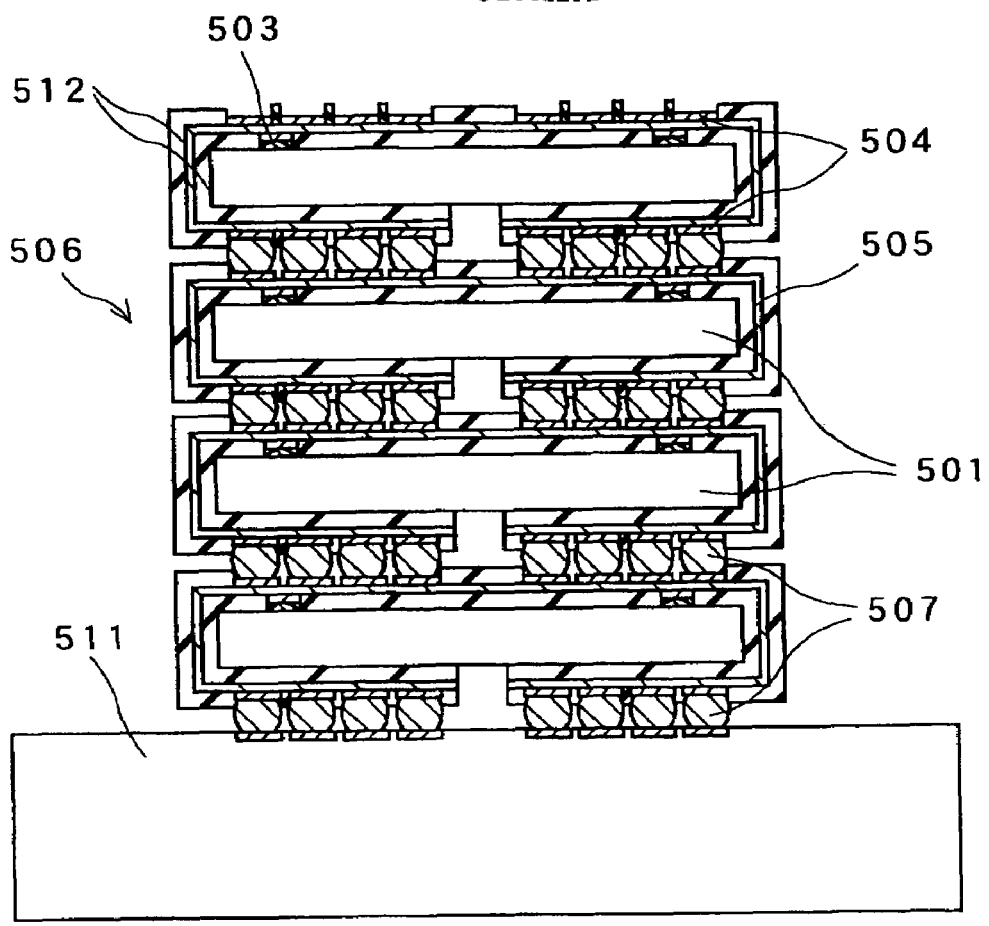
FIG. 28 is a cross-sectional view showing the stacked semiconductor package being packaged on a mother board substrate.
Figure 29:
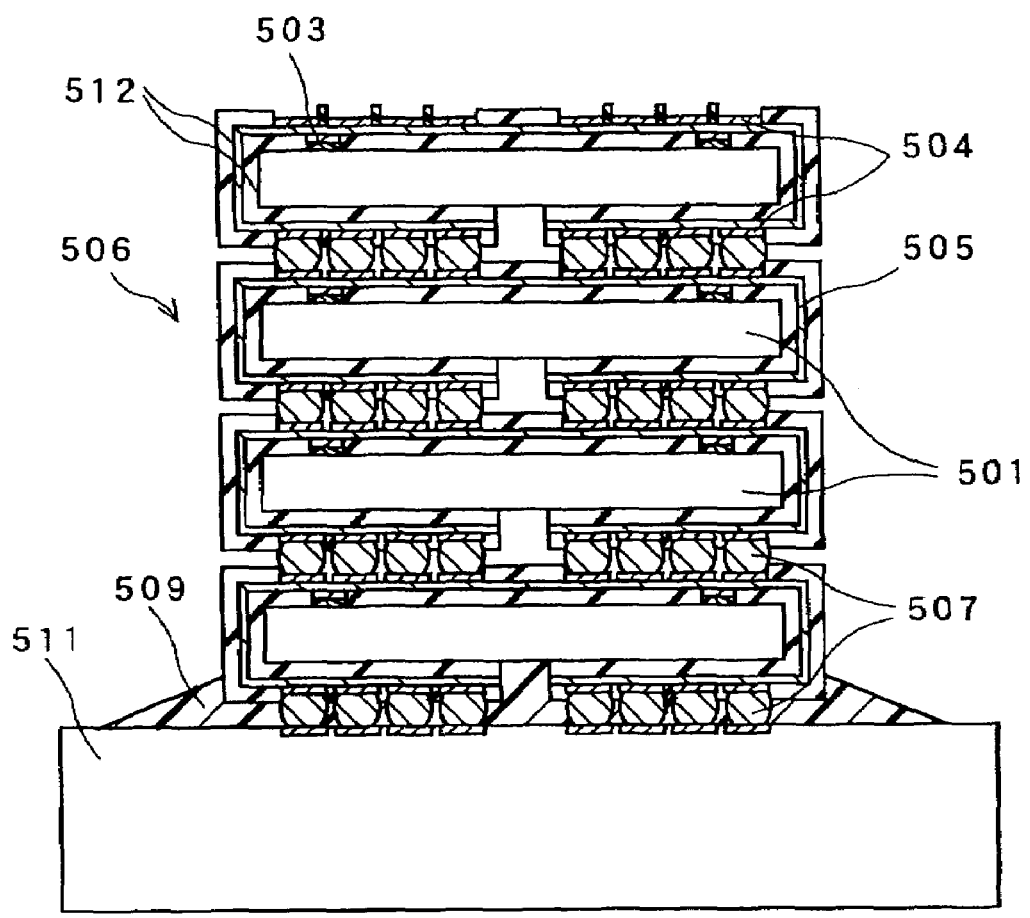
FIG. 29 is a cross-sectional view showing an insulating resin being filled.

FIG. 19 is a cross-sectional view showing a stacked semiconductor package according to a seventh embodiment of the present invention. A semiconductor package 301e includes a plurality of semiconductor devices shown in FIG. 18, and is configured such that the semiconductor package shown in FIG. 17 is mounted on the semiconductor package 301e, the semiconductor package shown in FIG. 14 is further mounted thereon, and two stages of the semiconductor packages shown in FIG. 1 are still further mounted thereon. This three-dimensionally packaged semiconductor package is packaged on the mother board substrate 7.

The semiconductor packages according to the present invention can be combined in this manner to thereby fabricate a semiconductor package that can be three-dimensionally packaged regardless of the number of input/output leads and the outer dimensions of the semiconductor devices.

The invention claimed is:

1. A semiconductor package comprising:
    a semiconductor device with one or more device-side electrodes being formed on a circuit-bearing surface; and
    a flexible substrate having a patterned wiring and a thermoplastic insulating layer formed on either or both sides of the patterned wiring, the flexible substrate being bent around said semiconductor device, wherein:
    said flexible substrate has a first electrode provided on said semiconductor device-side surface of said flexible substrate, the first electrode being connected to said device-side electrode of said semiconductor device and sealed by said thermoplastic insulating layer, and a second electrode provided on a surface different from the surface on which said first electrode is provided;
    said flexible substrate has at least two or more layers of patterned wiring formed thereon;
    said thermoplastic insulating layer is an adhesive; and
    said flexible substrate has a portion which is thinner or has a smaller number of wiring layers formed at a bend of said flexible substrate or on a region including the bend than at another portion of the flexible substrate.

2. The semiconductor package according to claim 1, wherein
    said flexible substrate has a cavity formed on said flexible substrate so as to accommodate said semiconductor device in said cavity portion.

3. A semiconductor package comprising:
    a semiconductor device with one or more device-side electrodes being formed on a circuit-bearing surface; and
    a flexible substrate having a patterned wiring and a thermoplastic insulating layer formed on either or both sides of the patterned wiring, the flexible substrate being bent around said semiconductor device, wherein:
    said flexible substrate has a first electrode provided on said semiconductor device-side surface of said flexible substrate, the first electrode being connected to said device-side electrode of said semiconductor device and sealed by said thermoplastic insulating layer, and a second electrode provided on a surface different from the surface on which said first electrode is provided;
    said flexible substrate has at least two or more layers of patterned wiring formed thereon; and
    wherein said flexible substrate includes portions which are folded back to be directly adhered to each other, the folded-back portions defining a recessed portion, said semiconductor device being disposed within said recessed portion.

4. A semiconductor package comprising:
    a semiconductor device with one or more device-side electrodes being formed on a circuit-bearing surface; and
    a flexible substrate having a patterned wiring and a thermoplastic insulating layer formed on either or both sides of the patterned wiring, said flexible substrate being bent around said semiconductor device, wherein:
    said flexible substrate has a first electrode provided on said semiconductor device-side surface of the flexible substrate, said first electrode being connected to the device-side electrode of said semiconductor device and sealed by said thermoplastic insulating layer, and a second electrode provided on a surface different from the surface on which said first electrode is provided; and
    said flexible substrate includes portions which are folded back at bends to be directly adhered to each other.

5. The semiconductor package according to claim 4, wherein
    the semiconductor device is accommodated in a recessed portion created by the portions of said flexible substrate being folded back to be directly adhered to each other.

6. The semiconductor package according to claim 2, wherein the cavity is formed by a portion of the flexible substrate having a smaller number of wiring layers than the another portion of the flexible substrate.

7. The semiconductor package according to claim 2, wherein the cavity is formed by a portion of the flexible substrate being thinner than the another portion of the flexible substrate.

8. A semiconductor package comprising:
    a semiconductor device with one or more device-side electrodes being formed on a circuit-bearing surface; and
    a flexible substrate having a patterned wiring and a thermoplastic insulating layer formed on either or both sides of the patterned wiring, the flexible substrate being bent around said semiconductor device, wherein:
    said flexible substrate has a first electrode provided on said semiconductor device-side surface of said flexible substrate, the first electrode being connected to said device-side electrode of said semiconductor device and sealed by said thermoplastic insulating layer, and a second electrode provided on a surface different from the surface on which said first electrode is provided;
    said flexible substrate has at least two or more layers of patterned wiring formed thereon;
    said thermoplastic insulating layer is an adhesive;
    said flexible substrate has a cavity formed on said flexible substrate so as to accommodate said semiconductor device in said cavity portion; and
    the cavity is formed by a portion of the flexible substrate having a smaller number of wiring layers than another portion of the flexible substrate.

9. A semiconductor package comprising:
    a semiconductor device with one or more device-side electrodes being formed on a circuit-bearing surface; and
    a flexible substrate having a patterned wiring and a thermoplastic insulating layer formed on either or both sides of the patterned wiring, the flexible substrate being bent around said semiconductor device, wherein:
    said flexible substrate has a first electrode provided on said semiconductor device-side surface of said flexible substrate, the first electrode being connected to said device-side electrode of said semiconductor device and sealed by said thermoplastic insulating layer, and a second electrode provided on a surface different from the surface on which said first electrode is provided;

said flexible substrate has at least two or more layers of patterned wiring formed thereon;

said thermoplastic insulating layer is an adhesive;

said flexible substrate has a cavity formed on said flexible substrate so as to accommodate said semiconductor device in said cavity portion; and the cavity is formed by a portion of the flexible substrate being thinner than another portion of the flexible substrate.

* * * * *